United States Patent
Cheng et al.

(10) Patent No.: US 10,217,868 B2
(45) Date of Patent: *Feb. 26, 2019

(54) AIRGAP SPACERS

(71) Applicant: INTERNATIONAL BUSINESS MACHINES CORPORATION, Armonk, NY (US)

(72) Inventors: Kangguo Cheng, Schenectady, NY (US); Zuoguang Liu, Schenectady, NY (US); Chun W. Yeung, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 154 days.

This patent is subject to a terminal disclaimer.

(21) Appl. No.: 15/342,635

(22) Filed: Nov. 3, 2016

(65) Prior Publication Data
US 2017/0243968 A1 Aug. 24, 2017

Related U.S. Application Data

(63) Continuation of application No. 15/047,123, filed on Feb. 18, 2016, now Pat. No. 9,673,293.

(51) Int. Cl.
H01L 29/78 (2006.01)
H01L 29/49 (2006.01)
(Continued)

(52) U.S. Cl.
CPC ........ *H01L 29/785* (2013.01); *H01L 21/0214* (2013.01); *H01L 21/823431* (2013.01); *H01L 21/823821* (2013.01); *H01L 21/823864* (2013.01); *H01L 27/0886* (2013.01); *H01L 29/0847* (2013.01); *H01L 29/161* (2013.01); *H01L 29/165* (2013.01); *H01L 29/1608* (2013.01); *H01L 29/4991* (2013.01); *H01L 29/6653* (2013.01); *H01L 29/6656* (2013.01); *H01L 29/66545* (2013.01);
(Continued)

(58) Field of Classification Search
CPC ......... H01L 29/4991; H01L 21/823864; H01L 29/165; H01L 29/1608; H01L 27/0886; H01L 29/66545; H01L 29/7848; H01L 29/0847; H01L 29/66795; H01L 29/7851; H01L 29/161; H01L 21/823821
USPC ....................................................... 257/386
See application file for complete search history.

(56) References Cited

U.S. PATENT DOCUMENTS

| | | | | |
|---|---|---|---|---|
| 2013/0049132 A1* | 2/2013 | Doris | .................. | H01L 21/7682 257/383 |
| 2013/0093019 A1* | 4/2013 | Ando | ................ | H01L 29/66803 257/347 |
| 2016/0141417 A1* | 5/2016 | Park | .................. | H01L 29/66545 257/365 |

OTHER PUBLICATIONS

List of IBM Patents or Patent Applications Treated as Related dated Nov. 3, 2016, 2 pages.

* cited by examiner

Primary Examiner — Fernando L Toledo
Assistant Examiner — Adam S Bowen
(74) Attorney, Agent, or Firm — Tutunjian & Bitetto, P.C.; Vazken Alezanian

(57) ABSTRACT

Semiconductor devices with airgap spacers and methods of forming the same include forming a lower spacer that defines a gate region. A sacrificial upper spacer is formed directly above the lower spacer. A gate stack is formed in the gate region. The sacrificial upper spacer is etched away to form an upper spacer opening. An airgap spacer is formed in
(Continued)

the upper spacer opening. The airgap spacer includes a dielectric material that encapsulates an internal void.

11 Claims, 9 Drawing Sheets

(51) Int. Cl.
*H01L 29/08* (2006.01)
*H01L 29/16* (2006.01)
*H01L 29/161* (2006.01)
*H01L 29/165* (2006.01)
*H01L 29/66* (2006.01)
*H01L 21/8238* (2006.01)
*H01L 27/088* (2006.01)
*H01L 21/02* (2006.01)
*H01L 21/8234* (2006.01)

(52) U.S. Cl.
CPC .... *H01L 29/66795* (2013.01); *H01L 29/7848* (2013.01); *H01L 29/7851* (2013.01)

AIRGAP SPACERS

BACKGROUND

Technical Field

The present invention relates to semiconductor devices and, more particularly, to forming airgap spacers without compromising high-k gate dielectric integrity.

Description of the Related Art

As semiconductor fabrication processes improve and the pitch of contacts reduces, an increase in parasitic capacitance between the source and drain contacts of a field effect transistor (FET) results due to thinning of the dielectric spacers between the contacts. Airgap spacers are used to reduce the parasitic capacitance.

In forming conventional airgap spacers, a sacrificial spacer is first formed on the gate sidewalls to protect the gate during downstream processes such as source/drain epitaxy and contact formation. The sacrificial spacers are then removed and replaced to create a gap between the gate and the source/drain contacts.

Spacer removal in this flow is usually a timed etch process. If the spacer etch is too aggressive, the etch may reach to the gate dielectric in the channel region and cause unreliability in the gate dielectric. If the spacer etch is too conservative, the airgap spacer that is produced is too short and the reduction of the parasitic capacitance is less strong. This imprecision makes conventional airgap spacers inadequate for use in small-scale device.

SUMMARY

A method of forming a semiconductor device includes forming a lower spacer that defines a gate region. A sacrificial upper spacer is formed directly above the lower spacer. A gate stack is formed in the gate region. The sacrificial upper spacer is etched away to form an upper spacer opening. An airgap spacer is formed in the upper spacer opening. The airgap spacer includes a dielectric material that encapsulates an internal void.

A method for forming a semiconductor device includes forming one or more semiconductor fins on a substrate. An initial spacer is formed that defines a gate region. The initial spacer is etched down to a top level of the one or more semiconductor fins to form a lower spacer. A sacrificial upper spacer is formed directly above the lower spacer. A gate stack is formed in the gate region. The sacrificial upper spacer is etched away to form an upper spacer opening. An airgap spacer is formed in the upper spacer opening that comprises a dielectric material that encapsulates an internal void.

A semiconductor device includes a semiconductor fin formed on a substrate. A gate stack formed across and over a channel region of the semiconductor fin. An airgap spacer is formed around the gate stack. The airgap spacer includes a dielectric material that encapsulates an internal void.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide airgap spacers that are positioned directly above a transistor fin in, e.g., a fin field effect transistor (FinFET). High-k dielectric around the fin remains intact during formation of the airgap spacer to ensure reliability. A bilayer dummy gate is used to limit formation of a sacrificial spacer to only be above the fin. The result is a FinFET with a low-k dielectric spacer at the fin level and an airgap spacer above the fin.

Figure 1:
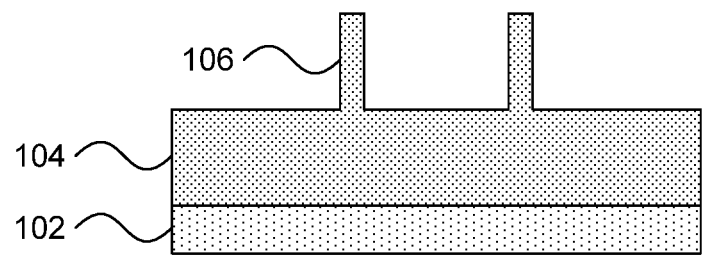
FIG. 1 is a cross-sectional diagram of a step in forming a semiconductor device with airgap spacers in accordance with the present principles.

Referring now to the drawings in which like numerals represent the same or similar elements and initially to FIG. 1, a cross-sectional view of a step in forming a semiconductor device is shown. A substrate is formed from a semiconductor layer 104 on an insulator layer 102. It should be recognized that the substrate may alternatively be formed from a bulk semiconductor material. One or more fins 106 are formed in the semiconductor layer 104.

In one example, the semiconductor layer 104 may be formed from a silicon-containing material. Illustrative examples of silicon-containing materials suitable for the bulk-semiconductor substrate include, but are not limited to, silicon, silicon germanium, silicon germanium carbide, silicon carbide, polysilicon, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc selenide.

Alternatively, the semiconductor layer 104 may be formed from a type III-V semiconductor material. This denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of aluminum antimonide, aluminum arsenide, aluminum nitride, aluminum phosphide, gallium arsenide, gallium phosphide, indium antimonide, indium arsenic, indium nitride, indium phosphide, aluminum gallium arsenide, indium gallium phosphide, aluminum indium arsenic, aluminum indium antimonide, gallium arsenide nitride, gallium arsenide antimonide, aluminum gallium nitride, aluminum gallium phosphide, indium gallium nitride, indium arsenide antimonide, indium gallium antimonide, aluminum gallium indium phosphide, aluminum gallium arsenide phosphide, indium gallium arsenide phosphide, indium arsenide antimonide phosphide, aluminum indium arsenide phosphide, aluminum gallium arsenide nitride, indium gallium arsenide nitride, indium aluminum arsenide nitride, gallium arsenide antimonide nitride, gallium indium nitride arsenide aluminum antimonide, gallium indium arsenide antimonide phosphide, and combinations thereof.

The fins 106 may be formed by any appropriate fabrication process. In particular, it is contemplated that an anisotropic etch process may be used. Such a process etches material in the direction normal to the surface to be etched at a rate that is greater than the etching rate in the direction parallel to the surface to be etched. In particular, it is contemplated that reactive ion etching (RIE) may be used. RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present embodiments include ion beam etching, plasma etching or laser ablation. Alternatively, the fin structures 106 can be formed by spacer imaging transfer technique well-known in the art.

Figure 2:
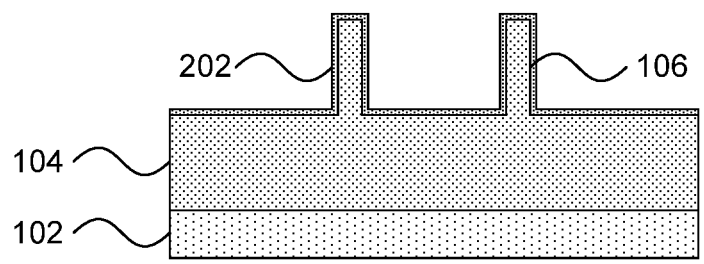
FIG. 2 is a cross-sectional diagram of a step in forming a semiconductor device with airgap spacers in accordance with the present principles.

Referring now to FIG. 2, a cross-sectional view of a step in forming a semiconductor device is shown. A dummy gate dielectric layer 202 is deposited over the fin(s) 106. It is specifically contemplated that a chemical vapor deposition (CVD) process may be employed to conformally deposit the dummy gate dielectric layer 202 at an even thickness on all surfaces of the fins 106, but atomic layer deposition (ALD), physical vapor deposition (PVD), or gas cluster ion beam (GCIB) deposition may be used instead.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EPCVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition. Alternatively, the dummy gate dielectric layer 202 can be formed by thermal oxidation, thermal nitridation, and thermal oxynitridation.

Figure 3:
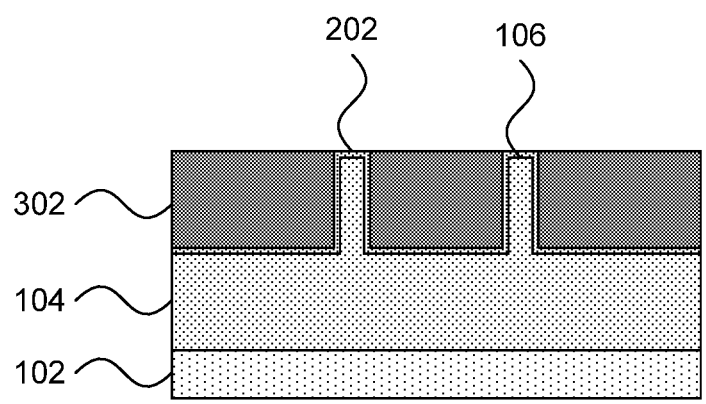
FIG. 3 is a cross-sectional diagram of a step in forming a semiconductor device with airgap spacers in accordance with the present principles.

Referring now to FIG. 3, a cross-sectional view of a step in forming a semiconductor device is shown. A first dummy gate 302 is formed on the dummy gate dielectric layer 202 and perpendicular to the fins 106. The first dummy gate 302 is formed with a first dummy gate material and it is specifically contemplated that this material may be amorphous silicon or polycrystalline silicon. The dummy gate 302 will eventually be removed, so other materials may be used without affecting the functioning of the device as long as the material(s) selected has etch selectivity with the later-added materials, as described in more detail below.

The first dummy gate 302 may be deposited by any appropriate mechanism. It is specifically contemplated that masks may be used to define a location for the first dummy gate 302 and that CVD, ALD, PVD, or GCIB deposition may be used to deposit the first dummy gate material. After deposition, the first dummy gate material is polished down to the level of the top of the dummy gate dielectric layer 202 on the fin(s) 106. This polish may be performed using a chemical mechanical planarization process that uses, e.g., a chemical or granular slurry and mechanical force to gradually remove upper layers of the device. The slurry may be formulated to be unable to dissolve, for example, the dummy gate dielectric material in layer 202, resulting in the CMP process's inability to proceed downward any farther than that layer.

Figure 4:
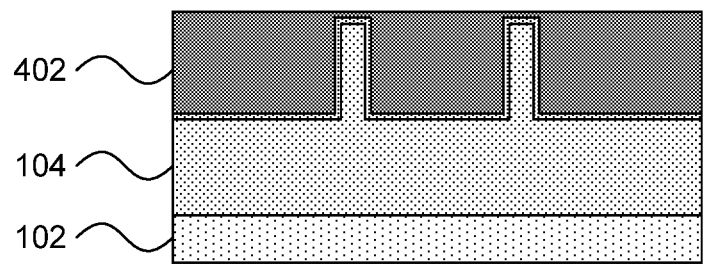
FIG. 4 is a cross-sectional diagram of a step in forming a semiconductor device with airgap spacers in accordance with the present principles.

Referring now to FIG. 4, a cross-sectional view of a step in forming a semiconductor device is shown. A small amount of additional first dummy gate material is deposited to extend the height of the first dummy gate above the top level of the fins 106 with the dummy gate dielectric layer 202 to form extended first dummy gate 402. For brevity, the extended first dummy gate 402 will be referred to hereinafter as the "first dummy gate 402." The additional first dummy gate material may be deposited using any appropriate deposition process including, for example, CVD, ALD, PVD, and GCIB deposition.

Figure 5:
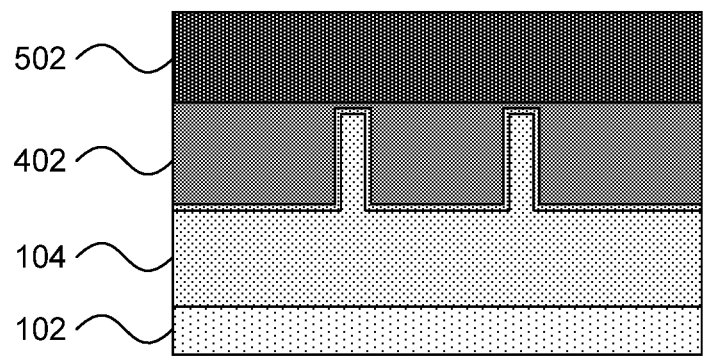
FIG. 5 is a cross-sectional diagram of a step in forming a semiconductor device with airgap spacers in accordance with the present principles.

Referring now to FIG. 5, a cross-sectional view of a step in forming a semiconductor device is shown. A second dummy gate 502 is deposited on the first dummy gate 402. It is specifically contemplated that the second dummy gate may be formed from amorphous silicon germanium or polycrystalline silicon germanium, but as with the first dummy gate 402, any appropriate material may be used with etch selectivity relative to the relevant materials. In particular, the material of the second dummy gate 502 should have etch selectivity relative to the material of the first dummy gate 402, such that the second dummy gate 502 can later be removed without affecting the first dummy gate 402. The thin layer of the first dummy gate 402 above the fins 106 prevents later airgap spacer fabrication steps from affecting the gate stack below the fin level.

Figure 6:
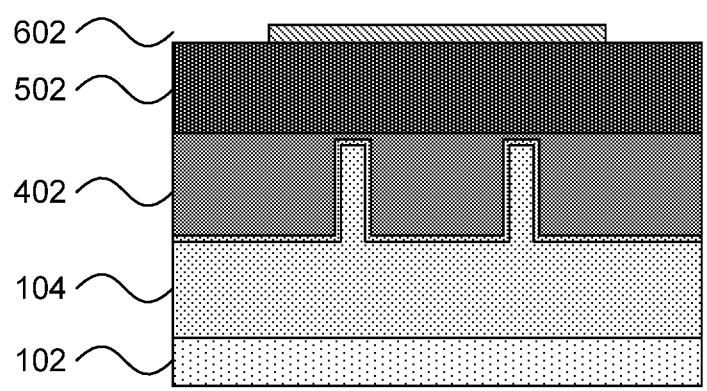
FIG. 6 is a cross-sectional diagram of a step in forming a semiconductor device with airgap spacers in accordance with the present principles.

Referring now to FIG. 6, a cross-sectional view of a step in forming a semiconductor device is shown. A dummy gate hardmask 602 is deposited over the second dummy gate 502. It is specifically contemplated that the dummy gate hardmask 602 may be formed from silicon nitride deposited by CVD, but any appropriate dielectric material and deposition process may be employed instead. Other materials for the dummy gate hardmask 602 may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG). In some embodiments, the dummy gate hardmask 602 may be formed from more than one layer of materials. For example, gate hardmask 602 may include a silicon oxide layer on top of a silicon nitride layer.

In one embodiment, the dummy gate hardmask 602 may be formed by blanket depositing a layer of hardmask material via CVD, providing a patterned photoresist on top of the layer of hardmask material, and then etching the layer of hardmask material to provide the dummy gate hardmask 602. A patterned photoresist can be produced by applying a blanket photoresist layer to the surface of the device, exposing the photoresist layer to a pattern of radiation, and then developing the pattern into the photoresist layer utilizing resist developer. Etching of the exposed portion of the hardmask material that is overlying second dummy gate 502 may include an etch chemistry for removing the exposed portion of the hardmask material and having a high selectivity to at least the first dummy gate 402, the second dummy gate 502, and the semiconductor layer 104 that is present in the device region. In one embodiment, the etch process may be an anisotropic etch process, such as RIE. Any other suitable patterning technique such as sidewall image transfer can also be used to pattern the hardmask.

In some embodiments, following the formation of the dummy gate hardmask 602, the exposed surface of the semiconductor layer 104 is cleaned to remove any residual layers, foreign particles, and any residual metallic surface contamination. In one embodiment, the chemical cleaning process includes a first step of treating the exposed portion of the semiconductor layer 104 with hydrofluoric acid, a second step of treating the surface of the exposed portion of the semiconductor layer 104 with a solution of ammonium hydroxide and hydrogen peroxide, and a third step of treating the surface with an aqueous mixture of hydrochloric acid and an oxidizing agent selected from the group consisting of hydrogen peroxide, ozone and combinations thereof. The cleaning steps that include the application of the solution of ammonium hydroxide and hydrogen peroxide and the aqueous mixture of hydrochloric acid and the oxidizing agent may be provided by an RCA clean sequence.

Figure 7:
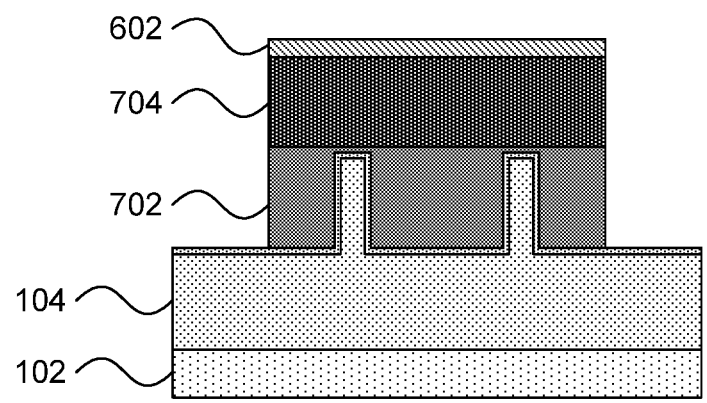
FIG. 7 is a cross-sectional diagram of a step in forming a semiconductor device with airgap spacers in accordance with the present principles.

Referring now to FIG. 7, a cross-sectional view of a step in forming a semiconductor device is shown. The first dummy gate 402 and the second dummy gate 404 are etched using the dummy gate hardmask 602 as a mask, leaving first dummy gate 702 and second dummy gate 704. An anisotropic etch, such as RIE, is used to remove the material.

Figure 8:
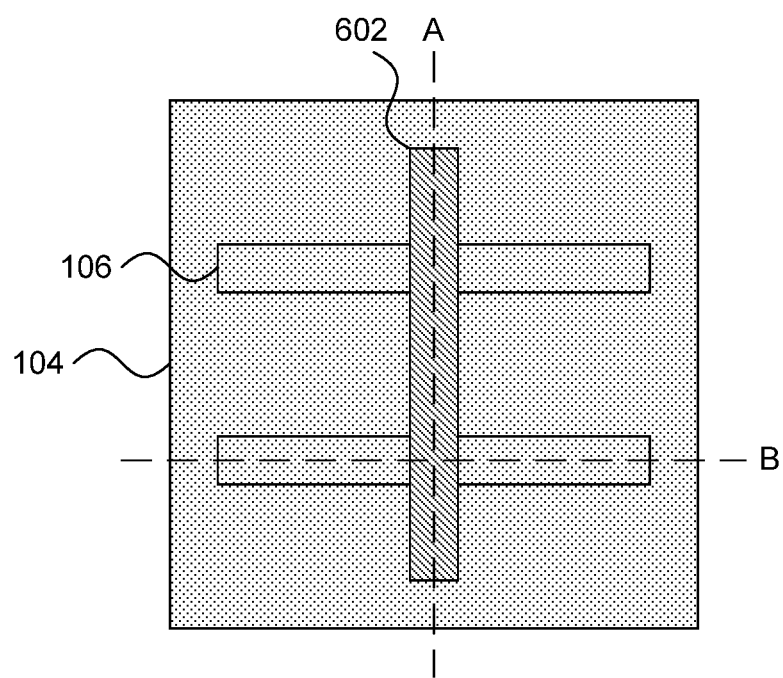
FIG. 8 is a top-down diagram of a step in forming a semiconductor device with airgap spacers in accordance with the present principles.

Referring now to FIG. 8, a top-down view of a step in forming a semiconductor device is shown. The second dummy gate 502 is shown over the fins 106 on the semiconductor layer 104. This view establishes two cuts for future cross-sectional views: cut A slices along the length of the dummy gates 402 and 502, while cut B slices along the length of one of a fin 106. The cross-sectional views of FIGS. 1-7 have all been along cut A.

Figure 9:
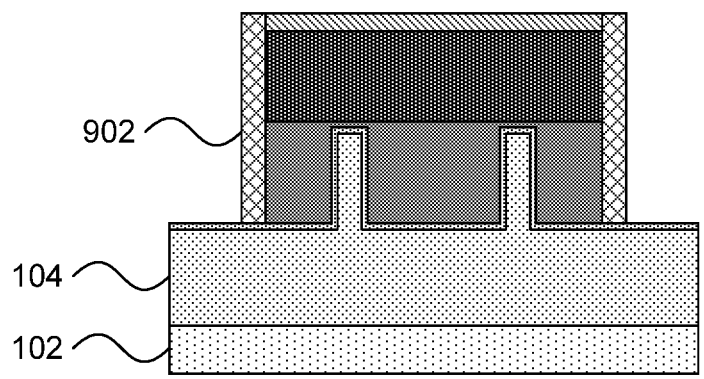
FIG. 9 is a cross-sectional diagram of a step in forming a semiconductor device with airgap spacers in accordance with the present principles.

Referring now to FIG. 9, a cross-sectional view of a step in forming a semiconductor device along cut A is shown. A low-k spacer 902 is formed around the dummy gates 802/804. The low-k spacer 902 is formed from a low-k dielectric material, defined as a material having a dielectric constant k less than that of silicon nitride (i.e., less than about 7). It is particularly contemplated that the low-k spacer 902 may be formed from a composition of silicon, boron, carbon, and nitrogen (SiBCN). Alternative materials for the low-k spacer 902 include compositions of silicon, carbon, oxygen, and hydrogen, an aromatic hydrocarbon polymer composition, such as SILK™, carbon-doped oxides, or an undoped silica glass.

Figure 10:
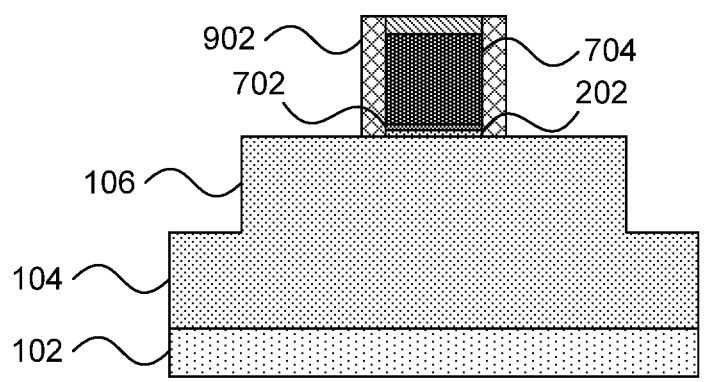
FIG. 10 is a cross-sectional diagram of a step in forming a semiconductor device with airgap spacers in accordance with the present principles.

Referring now to FIG. 10, a cross-sectional view of a step in forming a semiconductor device along cut B is shown. This view shows the dummy gate stack built on a fin 106. Notably, a small layer of the first dummy gate 702 rests on the dummy gate oxide 202. The dummy gate stack occupies a central channel portion of the fin 106, leaving exposed source and drain regions of the fin 106.

Figure 11:
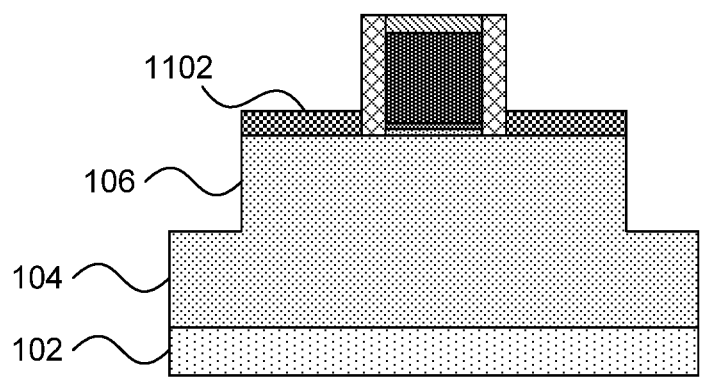
FIG. 11 is a cross-sectional diagram of a step in forming a semiconductor device with airgap spacers in accordance with the present principles.

Referring now to FIG. 11, a cross-sectional view of a step in forming a semiconductor device along cut B is shown. Extended source/drain regions 1102 are formed on the fin(s) 106 outside of the low-k spacer 902. It should be recognized that the source/drain regions 1102 may be doped to form an n-p-n device or a p-n-p device by including dopant atoms in the extended source/drain regions 1102.

The dopant atom may be an n-type dopant or a p-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, nitrogen, gallium and indium. The concentration of dopant within the doped region is typically from about 1011 to about 1015 atoms/cm2, with a concentration of dopant within the doped region from about 1011 to about 1013 atoms/cm2 being more typical. As used herein, "n-type" refers to the addition of impurities that contributes free electrons to an intrinsic semiconductor. In a silicon containing substrate examples of n-type dopants, i.e., impurities, include but are not limited to antimony, arsenic, bismuth, lithium, and phosphorous. Dopants may be introduced by implantation or may be formed in situ as the extended source/drain regions 1102 are epitaxially grown. In some embodiments, the extended source/drain comprises is formed by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon can be doped during deposition (in situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the extended source/drain includes silicon or silicon germanium for p-type device. In some embodiments, the extended source/drain includes silicon or carbon-doped silicon for n-type devices. This carbon-doped silicon layer can be grown in the same chamber used for other epitaxy steps or in a dedicated epitaxy chamber. Greater carbon content or a thicker carbon-doped silicon layer can slow phosphorus diffusion without greatly affecting the rate of boron diffusion, so the carbon content and thickness can be tailored as needed. The carbon-doped silicon layer can be in the range of about 1 nm to about 10 nm thick and can include carbon in the range of about 0.2 to about 3.0%. In a preferred embodiment, the carbon-doped silicon layer can have a thickness of less than about 5 nm, or between about 1 nm and about 5 nm thick, with one specific embodiment being about 3 nm thick, and can have a carbon concentration between about 2% and about 2.5%. The carbon-doped silicon layer can be formed by traditional epitaxial processing or by a cyclical process. One such cyclical process includes a first epitaxial deposition. On exposed semiconductor surfaces, the epitaxial growth will be single crystal. Elsewhere, the growth will be amorphous. An etch using only an etchant gas such as chlorine or hydrochloric acid can preferentially attack the amorphous material. This etch can be timed to leave some crystalline material while removing all the amorphous material. Repeating this sequence can build up a desired thickness of crystalline material. In some embodiments, the epitaxial process is tuned to incorporate dopants in the extended source/drain. The dopant concentration (atomic concentration) may be in the range of $1 \times 10^{19}$ cm$^{-3}$ to $5 \times 10^{21}$ cm$^{-3}$, or preferably between $2 \times 10^{20}$ cm$^{-3}$ to $7 \times 10^{20}$ cm$^{-3}$.

In the case of type III-V semiconductors, dopant atoms from group IV, such a silicon, have the property that they can act as acceptors or donor depending on whether they occupy the site of group III or group V atoms respectively. Such impurities are known as amphoteric impurities.

Figure 12:
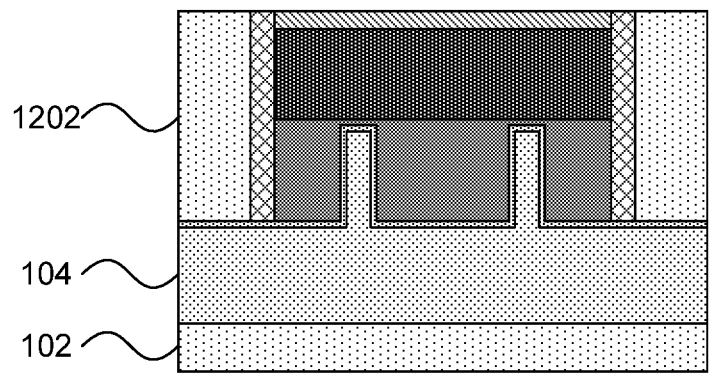
FIG. 12 is a cross-sectional diagram of a step in forming a semiconductor device with airgap spacers in accordance with the present principles.

Referring now to FIG. 12, a cross-sectional view of a step in forming a semiconductor device along cut A is shown. An interlayer dielectric (ILD) 1202 is deposited around the fin(s) 106 and dummy gate stack. It is specifically contemplated that the interlayer dielectric 1202 may be formed from any appropriate dielectric material including, for example, silicon dioxide. Alternative materials for the interlayer dielectric 1202 may include low-k dielectric materials may include fluorine- or carbon-doped silicon dioxide, organic polymeric dielectrics, and silicon-based polymeric dielectrics. In some embodiments, a dielectric liner such as silicon nitride (not shown) is deposited before the deposition of the ILD 1202.

Figure 13:
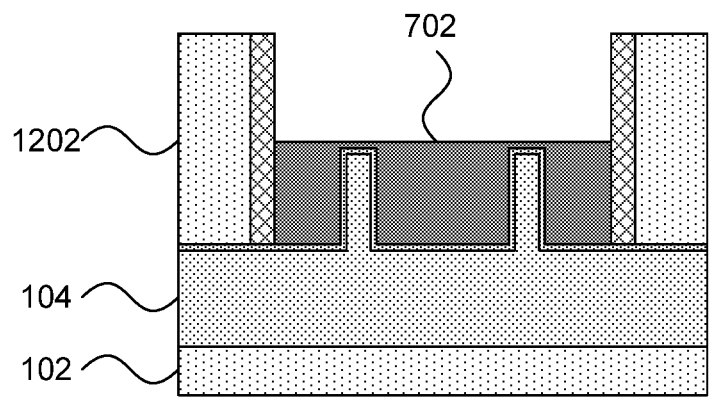
FIG. 13 is a cross-sectional diagram of a step in forming a semiconductor device with airgap spacers in accordance with the present principles.

Referring now to FIG. 13, a cross-sectional view of a step in forming a semiconductor device along cut A is shown. The dummy gate hardmask 602 and the second dummy gate 704 are removed by any appropriate etch including, for example, one or more wet chemical etches that are selective for the materials to be removed. The etch exposes the first dummy gate 702.

Figure 14:
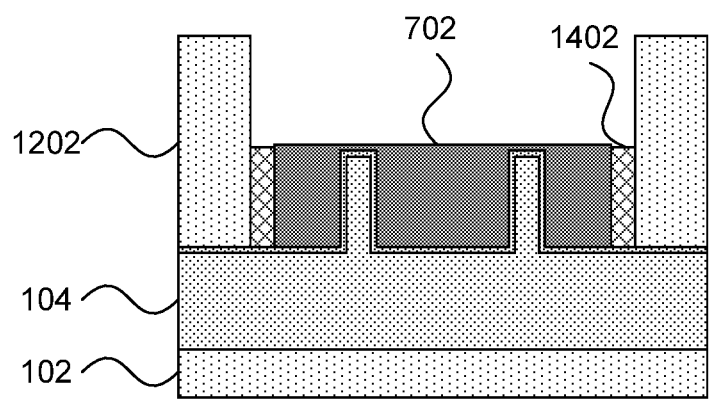
FIG. 14 is a cross-sectional diagram of a step in forming a semiconductor device with airgap spacers in accordance with the present principles.

Referring now to FIG. 14, a cross-sectional view of a step in forming a semiconductor device along cut A is shown. The low-k spacers 902 are etched down to the level of the first dummy gate 702, leaving lower spacers 1402. The material of the low-k spacers 902 is removed using a timed isotropic etch, which may be either a wet etch or a chemical dry etch.

Figure 15:
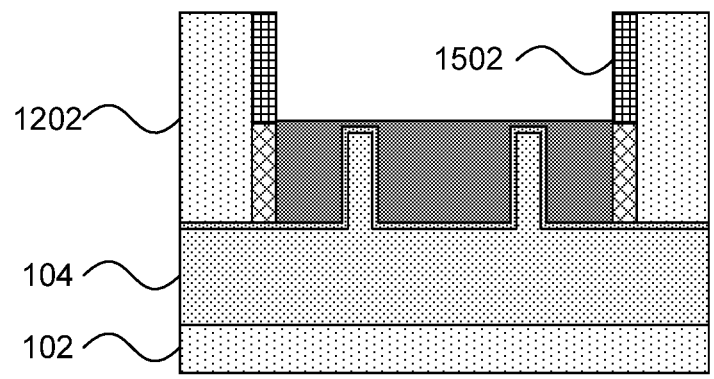
FIG. 15 is a cross-sectional diagram of a step in forming a semiconductor device with airgap spacers in accordance with the present principles.

Referring now to FIG. 15, a cross-sectional view of a step in forming a semiconductor device along cut A is shown. Upper sacrificial spacer 1502 is formed on the sidewalls of the inter-layer dielectric 1202 and above the lower spacers 1402. It is specifically contemplated that the upper sacrificial spacer 1502 may be formed from silicon nitride, but any other appropriate dielectric material may be used instead.

Figure 16:
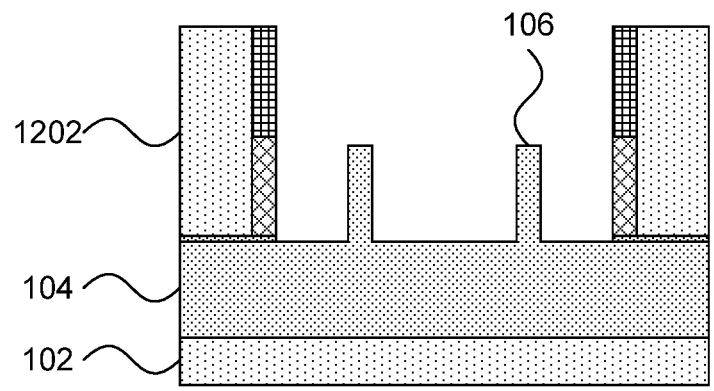
FIG. 16 is a cross-sectional diagram of a step in forming a semiconductor device with airgap spacers in accordance with the present principles.

Referring now to FIG. 16, a cross-sectional view of a step in forming a semiconductor device along cut A is shown. The first dummy gate 702 is removed along with the dummy gate dielectric layer 202, leaving the fin(s) 106 exposed between the spacers.

Figure 17:
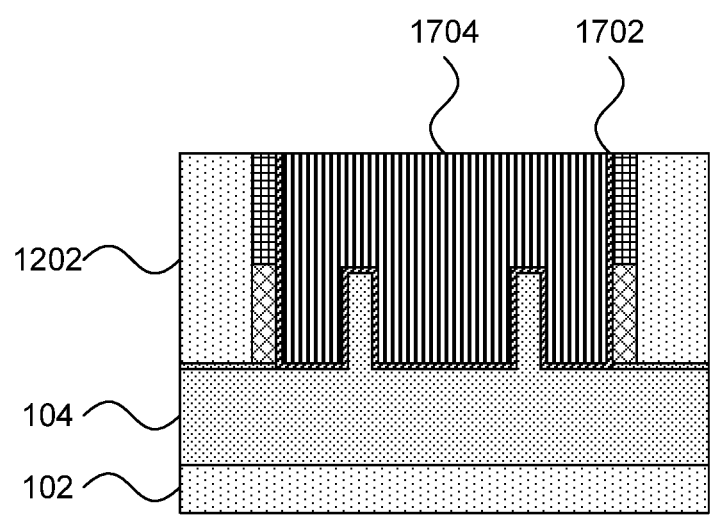
FIG. 17 is a cross-sectional diagram of a step in forming a semiconductor device with airgap spacers in accordance with the present principles.

Referring now to FIG. 17, a cross-sectional view of a step in forming a semiconductor device along cut A is shown. A gate dielectric 1702 is conformally deposited over the fin(s) 106. A gate 1704 is then deposited over the gate dielectric 1702. The gate dielectric 1702 may be any appropriate insulating material including, for example, silicon oxide, silicon nitride, silicon oxynitride, boron nitride, high-k materials, or any combination of these materials. Examples of high-k gate dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum. The gate 1704 may be formed from any appropriate material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The gate dielectric 1702 and the gate 1704 may be deposited by any appropriate process, with CVD being specifically contemplated.

Figure 18:
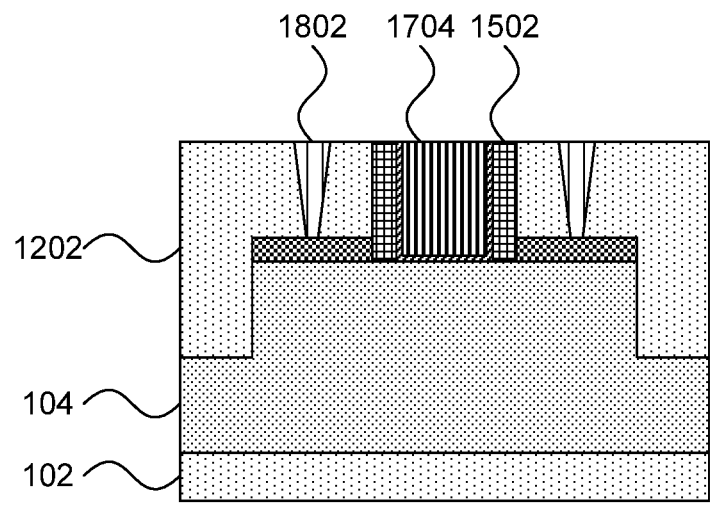
FIG. 18 is a cross-sectional diagram of a step in forming a semiconductor device with airgap spacers in accordance with the present principles.

Referring now to FIG. 18, a cross-sectional view of a step in forming a semiconductor device along cut B is shown. Contacts 1802 may be formed by anisotropically etching the interlayer dielectric 1202 and depositing a contact metal to provide electrical contact to the source/drain regions 1102.

Figure 19:
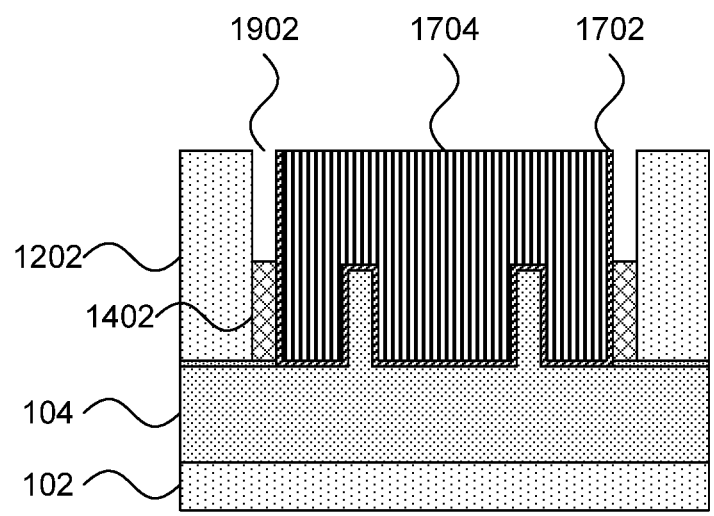
FIG. 19 is a cross-sectional diagram of a step in forming a semiconductor device with airgap spacers in accordance with the present principles.

Referring now to FIG. 19, a cross-sectional view of a step in forming a semiconductor device along cut A is shown. The sacrificial upper spacers 1502 are etched away using any appropriate etching technique including, e.g., a wet chemical etch or a timed anisotropic etch. This leaves gaps 1902 between the gate dielectric 1702 and the interlayer dielectric 1202 above the lower spacers 1402.

Figure 20:
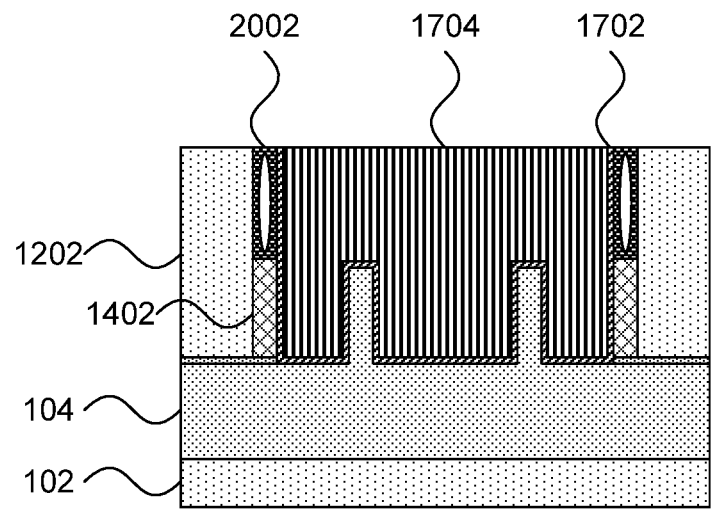
FIG. 20 is a cross-sectional diagram of a step in forming a semiconductor device with airgap spacers in accordance with the present principles.

Referring now to FIG. 20, a non-conformal dielectric is deposited in the gaps 1902 to form airgap spacers 2002. It is specifically contemplated that the non-conformal dielectric may be formed from a composition of silicon, oxygen, carbon, and nitrogen (SiOCN). The airgap spacer material can be deposited by a non-conformal deposition process, such as plasma enhanced chemical vapor deposition. The non-conformal deposition process deposits more material at the top portion of the gap than at the lower portion of the gap. As a result, once the airgap spacer material pinches off at the top, an air gap is formed. In exemplary embodiments, the air gap can be about 1 nm to about 10 nm wide (laterally) and about 3 nm to about 30 nm long (vertically). The airgap spacer is above the top of the fin(s) 106 so that the gate stack surrounding the fin 106, including gate dielectric 1702 and gate conductor 1704, is immune to any potential damage during the formation of the airgap spacer 2002.

Figure 21:
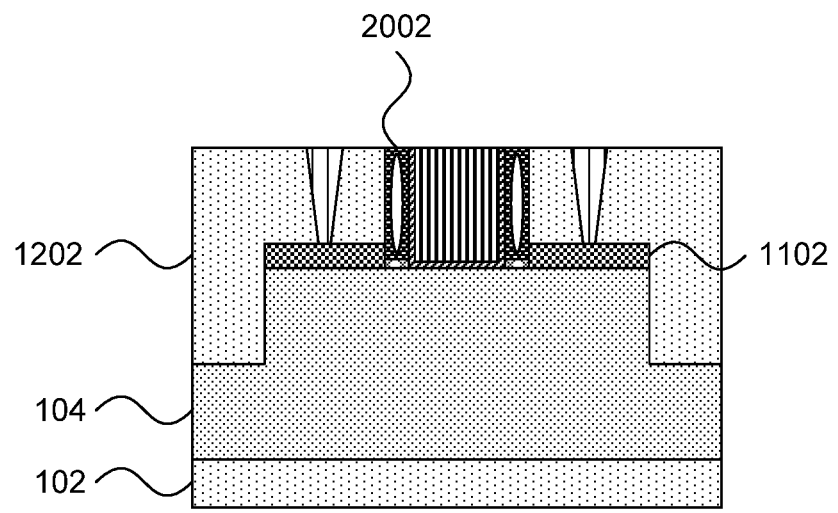
FIG. 21 is a cross-sectional diagram of a step in forming a semiconductor device with airgap spacers in accordance with the present principles.

Referring now to FIG. 21, a cross-sectional view of a step in forming a semiconductor device along cut B is shown. As can be seen, the gap in the airgap spacers 2002 is a three-dimensional void encapsulated by the non-conformal dielectric material.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 22:
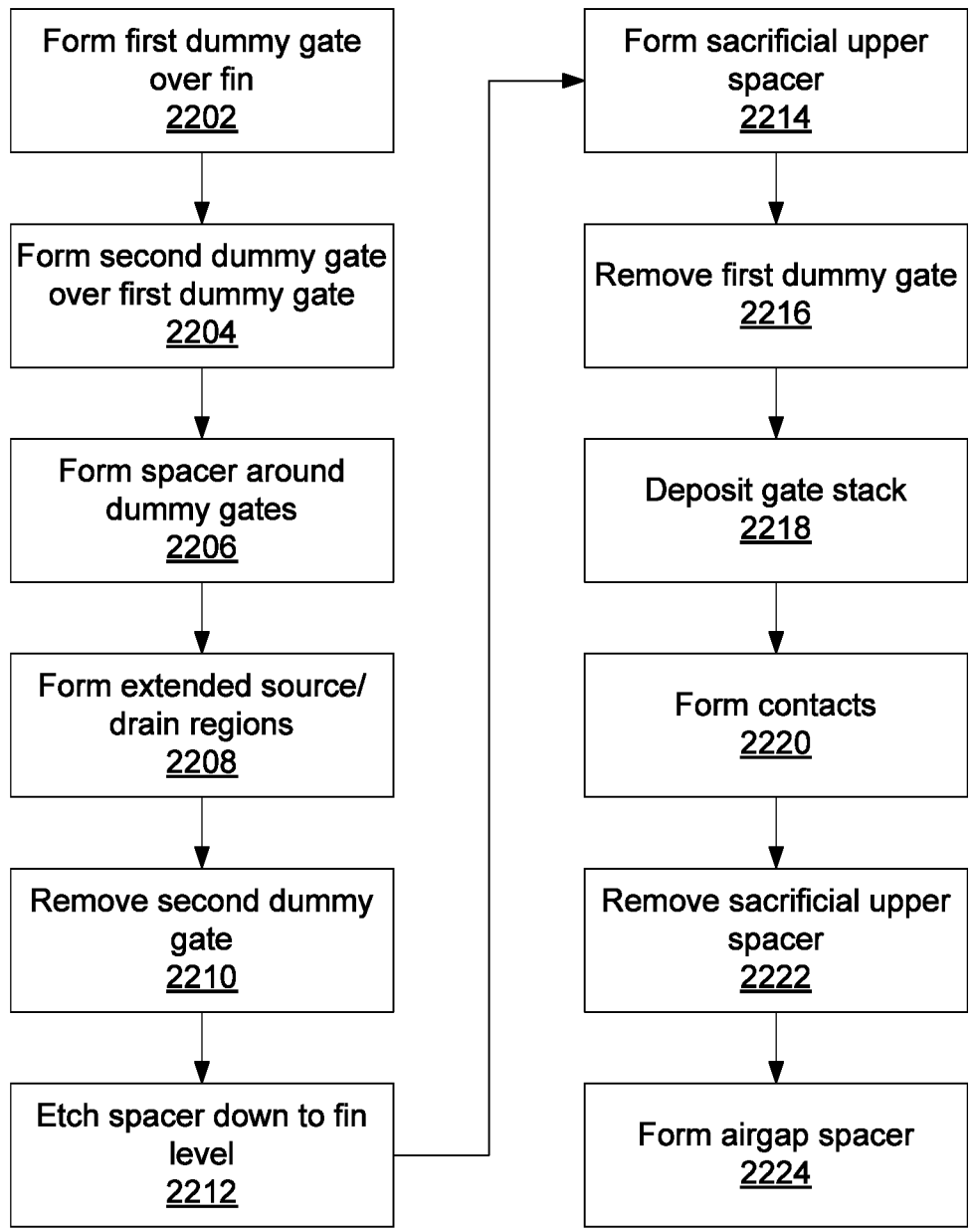
FIG. 22 is a block/flow diagram of a method of forming a semiconductor device with airgap spacers in accordance with the present principles.

Referring now to FIG. 22, a block/flow diagram of a method of forming airgap spacers is shown. Block 2202 forms a first dummy gate 702 over a semiconductor fin 106. Block 2204 then forms the second dummy gate 704 over the first dummy gate 702. Block 2206 forms a spacer 902 around the dummy gates 702/704. Block 2208 forms extended source/drain regions 1102 by epitaxially growing the semiconductor fin 106 around the spacer 902.

Block 2210 removes the second dummy gate 704 with, e.g., a wet chemical etch. Block 2212 then etches the spacer 902 down to the level of the fins using a lateral etch to create lower spacers 1402. Block 2214 forms a sacrificial upper spacer 1502 above the lower spacer 1402 and block 2216 removes the first dummy gate 702.

Block 2218 deposits the gate stack, including the gate dielectric 1702 and the gate itself 1704. Block 2220 forms contacts 1802 by etching through an interlayer dielectric 1202 to the extended source/drain regions 1102 and depositing a contact metal. Block 2222 removes the sacrificial upper spacer 1502 and block 2224 replaces it with an airgap spacer 2002 by depositing a non-conformal dielectric material that pinches off at the top.

Having described preferred embodiments of airgap spacers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming one or more semiconductor fins on a substrate;
   forming a first dummy gate across the one or more semiconductor fins;
   forming a second dummy gate over the first dummy gate, wherein a material of the first dummy gate is different from a material of the second dummy gate;
   etching away the second dummy gate;
   forming a lower spacer that defines a gate region after etching away the second dummy gate;
   forming a sacrificial upper spacer directly above the lower spacer;
   forming a gate stack in the gate region;
   etching away the sacrificial upper spacer to form an upper spacer opening; and
   forming an airgap spacer in the upper spacer opening that comprises a dielectric material that encapsulates an internal void.

2. The method of claim 1, wherein the first dummy gate has a height greater than a height of the one or more semiconductor fins.

3. The method of claim 1, further comprising etching away the first dummy gate after forming the sacrificial upper spacer.

4. The method of claim 1, further comprising forming an initial spacer, wherein forming the lower spacer comprises etching the initial spacer down to a top level of the one or more semiconductor fins.

5. The method of claim 4, further comprising depositing an interlayer dielectric layer around the initial spacer.

6. The method of claim 1, wherein forming the airgap spacer comprises non-conformally depositing a dielectric material that seals off a top opening of the upper spacer opening.

7. The method of claim 1, wherein the dielectric material comprises a composition of silicon, oxygen, carbon, and nitrogen (SiOCN).

8. The method of claim 1, wherein forming the airgap spacer comprises depositing the dielectric material using plasma enhanced chemical vapor deposition.

9. A method for forming a semiconductor device, comprising:
   forming one or more semiconductor fins on a substrate;
   forming an initial spacer that defines a gate region;
   etching the initial spacer down to a top level of the one or more semiconductor fins to form a lower spacer;
   forming a sacrificial upper spacer directly above the lower spacer;
   forming a gate stack in the gate region;
   etching away the sacrificial upper spacer to form an upper spacer opening; and
   forming an airgap spacer in the upper spacer opening that comprises a dielectric material that encapsulates an internal void.

10. The method of claim 9, wherein forming the airgap spacer comprises non-conformally depositing a dielectric material that seals off a top opening of the upper spacer opening.

11. The method of claim 9, wherein the dielectric material comprises a composition of silicon, oxygen, carbon, and nitrogen (SiOCN).

* * * * *